United States Patent [19]

Vodakov et al.

[11] 4,147,572
[45] Apr. 3, 1979

[54] METHOD FOR EPITAXIAL PRODUCTION OF SEMICONDUCTOR SILICON CARBIDE UTILIZING A CLOSE-SPACE SUBLIMATION DEPOSITION TECHNIQUE

[76] Inventors: Jury A. Vodakov, prospekt Engelsa, 69/1, kv. 35; Evgeny N. Mokhov, prospekt Energetikov, 54, korpus 2, kv. 59, both of Leningrad, U.S.S.R.

[21] Appl. No.: 881,714

[22] Filed: Feb. 27, 1978

Related U.S. Application Data

[63] Continuation of Ser. No. 733,196, Oct. 18, 1976, abandoned, which is a continuation of Ser. No. 636,444, Dec. 1, 1975, abandoned, which is a continuation of Ser. No. 542,196, Jan. 20, 1975, abandoned, which is a continuation of Ser. No. 446,541, Feb. 27, 1974, abandoned.

[51] Int. Cl.$^2$ .................. H01L 21/203; H01L 21/36
[52] U.S. Cl. .................. 148/175; 23/294 R; 156/603; 156/610; 156/DIG. 64; 252/62.3 C; 423/345
[58] Field of Search .............. 148/1.5, 174, 175; 423/345; 156/603, 610, DIG. 64; 252/62.3 C; 23/294 R

[56] References Cited

U.S. PATENT DOCUMENTS

| | | | |
|---|---|---|---|
| 2,854,364 | 9/1958 | Lely | 148/1.5 |
| 3,228,756 | 1/1966 | Hergenrother | 423/345 X |
| 3,236,780 | 2/1966 | Ozarow | 23/294 R X |
| 3,275,415 | 9/1966 | Chang et al. | 423/345 X |
| 3,291,657 | 12/1966 | Sirtl | 148/175 |
| 3,493,444 | 2/1970 | Sirtl et al. | 148/175 |
| 3,577,285 | 5/1971 | Rutz | 148/175 |
| 3,615,930 | 10/1971 | Knippenberg et al. | 148/175 |

OTHER PUBLICATIONS

Cuomo et al., "Growing Large Area Silicon Carbide . . . Crystals", I.B.M. Tech. Discl. Bull., vol. 17, No. 9, Feb. 1975, pp. 2819–2820.

*Primary Examiner*—L. Dewayne Rutledge
*Assistant Examiner*—W. G. Saba
*Attorney, Agent, or Firm*—Holman & Stern

[57] ABSTRACT

A method of producing epitaxial semiconductor monocrystal materials of silicon carbide with the silicon carbide crystals being grown by crystallizing sublimed silicon carbide vapors.

3 Claims, 2 Drawing Figures

METHOD FOR EPITAXIAL PRODUCTION OF SEMICONDUCTOR SILICON CARBIDE UTILIZING A CLOSE-SPACE SUBLIMATION DEPOSITION TECHNIQUE

CROSS-REFERENCES TO RELATED APPLICATIONS

This application is a continuation of application Ser. No. 733,196, filed Oct. 18, 1976 which in turn is a continuation of application Ser. No. 636,444, filed Dec. 1, 1975 which in turn is a continuation of application Ser. No. 542,196, filed Jan. 20, 1975 which in turn is a continuation of application Ser. No. 446,541, filed Feb. 27, 1974, all now abandoned.

BACKGROUND OF THE INVENTION

The present invention relates to methods of epitaxial production of semiconductor silicon carbide.

Semiconductor silicon carbide in the form of p-type or n-type monocrystals or epitaxial layers finds application in the manufacture of a number of semiconductor instruments, such as different high-temperature diodes, semiconductor light sources, thermistors, high-temperature sensors of mechanical values, superhigh-frequency (SHF) devices, etc.

Known in the art are several methods of producing semiconductor silicon carbide. The more conventional methods involve the production of semiconductor silicon carbide by the sublimation method, i.e. by growing silicon carbide crystals from supersaturated vapors thereof which are formed when evaporating solid silicon carbide (vapor source), and with the vapor source being maintained at a higher temperature than the temperature in the crystal growing chamber. The source of the silicon carbide vapor is provided by a pre-synthesized polycrystalline silicon carbide (either of abrasive or of semiconductor purity) or by silicon carbide directly synthesized from silicon and carbon vapors during the process of crystal growth. These high-temperature sublimation methods of growing single crystals of silicon carbide are based on the Lely method (A. Lely, Ber. Dent. Gesellsch., 32, 229, 1955).

The Lely method teaches the growing of silicon carbide crystals on spontaneously appearing nuclei of SiC at temperatures of from 2450° to 2700° C. This method of growing crystals requires special furnaces with graphite heaters and crucibles for growing the crystals. After vacuum degassing at temperatures of up to 2000° C., the furnace is filled with an inert gas, generally argon, to a pressure slightly exceeding atmospheric. Taking into consideration the insufficient area of the crucibles for growing crystals, the process of producing quality SiC crystals having a large surface area entails a sharp increase in the real volume of the crucible (which can be in the order of scores of liters) which is actually always filled with a finely dispersed or porous graphite heat insulation, i.e. the gas medium in the crucible is always mixed with the gas medium in the whole internal space of the furnace, with the result that impurities from the graphite insulation find their way into the crystal growing chamber of the crucible.

Thus the main disadvantage of the methods for growing SiC crystals based on the Lely technique is that the processes of crystal nucleation and growth are extremely difficult to control. The large real volume of the crucible, the need of using a large mass of porous graphite for the thermal insulation and for the structural members of the furnace, the extremely high temperatures required for carrying out the process in an inert gas media, which gases are difficult to purify of traces of gaseous impurities, of which involve all considerable difficulties in producing both pure and doped crystals. The fact that the process of crystal nucleation and growth is hard to control and the difficulties experienced in doping the crystals result in low yields of quality crystals. The high operating temperatures entail high energy consumption and excessive consumption of expensive graphite elements of the furnace. Thus, even low yields of crystals involve considerable specific costs per unit of production which render the process prohibitively inefficient.

A number of the above-mentioned disadvantages have been eliminated in a method wherein semiconductor silicon carbide is epitaxially produced by way of sublimation from a supersaturated vapor of SiC and using crystalline seeding with silicon carbide. The source of SiC vapor is a fine-grained silicon carbide disposed at a considerable distance, on the order of several centimeters, from the seed crystals which are oriented relative to the axis of the furnace at an angle selected by the trial-and-error method. The reduced operating pressure of the inert gas (down to 20 mm Hg) and the provision for the seed crystals permit the formation of crystalline layers at relatively low temperatures (under 2050° C.). The method of sublimation growing of SiC, however, also possesses a number of disadvantages, namely:

1. The difficulty of creating a controlled temperature differential in the crystal growth zone (growing chamber) and consequently the impossibility of ensuring a uniform temperature for each crystal, especially with large quantities thereof, which results in different conditions for the growth of crystal layers.

2. Poor controllability of the SiC vapor flow, leading to large losses of SiC vapors which flow past the growth zones of the crystal layers, with resulting large losses of pure silicon carbide.

3. The impossibility of any further decrease the growth temperatures by further reduction of the inert gas pressure owing to the resulting graphitization of crystal seeds.

All of the above disadvantage bound to render the process uneconomical and ineffective.

SUMMARY OF THE INVENTION

It is an object of the present invention to provide a method for epitaxial production of semiconductor silicon carbide which method ensures the control of the temperature range, and the silicon carbide vapor flow in the crystal growth zone.

Another object of the present invention is to reduce the losses of silicon carbide vapors in the process of producing both pure and doped crystals of semiconductor silicon carbide in a required area.

In accordance with the above-mentioned and other objects, the invention consists in that a source of silicon carbide vapors is sublimed to deposit the vapors on seeding crystals of silicon carbide. According to the invention the sublimation is carried out at a temperature of from 1600°–2400° C. and a pressure of from 1 at.g. to $10^{-5}$ mm Hg. The source of silicon carbide vapors and the seed crystals are arranged parallel to each other at a distance not more than 0.2 of the largest linear dimension of the source measured in the direction perpendicular to the distance separating the source and the seed crystals.

The concept of using a narrow slit-type gap between the source and the seed crystals has a positive effect on the whole process of sublimation growth of crystals. With the selected ratio between the gap width and the length of the source (not more than 0.2) properly observed, any loss of silicon carbide vapors in the lateral direction from the gap is completely excluded and the flow of its vapors takes the shortest optimal course from the source to the seed crystals. Now the process can be carried out at a considerably lower rarefaction owing to the fact that at the selected width of the gap the partial pressure of silicon, with which the equilibrium vapor over the silicon carbide is known to be enriched, is automatically maintained close to the equilibrium pressure. At the same time, without changing the partial pressure of silicon, the partial pressures of other components of the gaseous medium can be prescribed, that is of a doping element such as Be, B, Al, Ga, Sc, O, or N, which is introduced for the purpose of producing a semiconductor silicon carbide having prescribed properties, or of the inert gas such as argon or helium. The reduction in the partial pressure of the inert medium from 1 at.g. to $10^{-5}$ mm Hg permits the temperature of crystal growth to be reduced from 2400° to 1600° C., and the carrying out of the process of growing pure silicon carbide crystals since the residual partial pressures of uncontrollable doping agents of silicon carbide such as oxygen and nitrogen which are always present in an inert medium will be considerably lower under these conditions than the residual partial pressures of the inert gases under normal pressures.

The narrow gap also permits maintaining the required temperatures at the source and at the seed crystals and thus maintaining the required temperature differential therebetween. In addition, the gap also improves the uniformity of the temperature range along the seed crystals and the source and smoothens the local temperature deviations, which is essential for the high-quality growth of crystal layers.

Thus the present method offers the following advantages over the prior art methods:

1. It ensures a uniform temperature range along the entire working surface, with the temperature gradient (temperature difference between the source and the seed crystals) being easily controllable.

2. Optimal conditions for applying SiC vapor to the seed crystals with minimal losses, which is especially important in growing crystals by sublimation of high-purity silicon carbide.

3. It ensures the growth of silicon carbide under reduced pressures which permits the growth temperatures to be considerably reduced to values which are unattainable in other sublimation methods, and in fact down to the temperatures which are typical for the growing of SiC crystals by the gas-transportation methods. It also improves the purity of the gas-vapor medium and the controllability of its composition.

4. It reduces the real volume of the crucible which is important for the production of both pure and doped semiconductor silicon carbide.

5. It provides for the possibility of growing a large number of layers having large areas with identical properties in one process.

6. It also offers the possibility of controlling the thickness of the layers by means of changing the temperature of the process and the temperature differential between the source and the seed crystals as well as by varying the gap therebetween.

All of the above advantages permit the production of high-quality semiconductor silicon carbide while reducing the cost per unit of production due to a substantial reduction of the process temperatures, a sharp reduction in the high-purity silicon carbide losses during sublimation and a drastic reduction in the consumption of graphite furnace elements. The process considerably increases the yield of crystals having identical properties (from 10–50 as in the Lely process up to from 300–500 in the present process).

BRIEF DESCRIPTION OF THE DRAWINGS

The invention will now be explained in greater detail with reference to the embodiments thereof which are represented in the accompanying drawings, wherein.

DETAILED DESCRIPTION OF THE PREFERRED EMBODIMENT

Figures 1, 2:
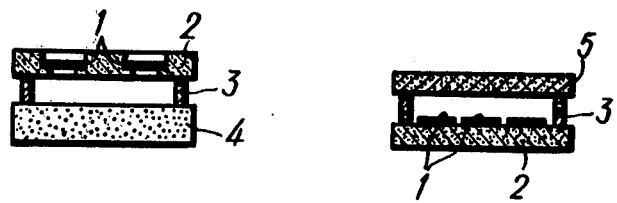
FIG. 1 schematically represents a cell for growing semiconductor silicon carbide, including a source of silicon carbide vapors in the form of a finely-dispersed SiC powder disposed under seed silicon carbide crystals.
FIG. 2 is a schematic representation of a cell for growing semiconductor silicon carbide, including a source of silicon carbide vapors in the form of a polycrystalline SiC plate disposed over the seed crystals of silicon carbide.

As shown in FIG. 1, a growth cell consists of seed crystals 1 of silicon carbide disposed on a graphite plate 2. A graphite thrust ring 3 separates the seed crystals from the source of SiC vapors, which is a finely-dispersed powder 4 disposed under the seed crystals. The gap between the seed crystals and the source of vapors is from 0.6 to 8 mm at a maximum linear dimension of the source of from 60 to 80 mm.

A polycrystalline SiC plate can also be used as the source of vapors.

The growth cell shown in FIG. 2 is similar to the growth cell shown in FIG. 1, with the exception that a polycrystalline plate 5 of silicon carbide disposed over the seed crystals serves as the source of silicon carbide vapors.

One or more cells shown in FIGS. 1 and 2 are placed in a graphite crucible (not shown in the FIGS.). Silicon carbide is doped with high-purity chemical elements as such or as compounds thereof. The elements or compounds thereof, either in a liquid or solid state, are placed in the cooler portion of the crucible. Gaseous elements or combinations thereof are introduced into the crucible through a special opening. The crucible is then placed in a furnace wherein the required temperature for the growth of crystals and a temperature differential between the vapor source and the seed crystals are created, with the furnace having been first degassed. The furnace is then filled with a pure inert gas at a pressure of 1 at.g. - $10^{-5}$ mm Hg, and the process of sublimation is carried out at a temperature of from 1600° to 2400° C.

A fuller understanding of the present invention will be had from the concrete examples given hereinbelow which, however, are illustrative only and do not serve to limit the possible embodiments thereof.

EXAMPLE 1

A high-purity non-doped semiconductor SiC was produced by growing epitaxial layers in a crucible made of a spectrally-pure pyrocarbon. The process was carried out under a vacuum of from $10^{-4}$ to $10^{-5}$ mm Hg, and at a temperature of from 1600° to 1850° C. The size of the source was from 40 to 50 mm and the gap between the source and the seed crystals was from 2 to 5 mm. Prior to starting the process, the system was thoroughly degassed at a temperature of up to 1500° C. and blasted with high-purity $H_2$ and He at a temperature of up to 1400° C.

EXAMPLE 2

A process for producing hole-type SiC doped with Al or Ga was carried out in a medium of Ar or He at normal pressures and a temperature of from 2000° to 2100° C. Ga or Al in the form of a spectrally-pure metal was placed in the cooler portion of the crucible having a temperature of from 1600° to 1950° C. The size of the source was from 60 to 80 mm and the gap was from 1 to 3 mm.

EXAMPLE 3

A process for producing thick (at least 100 microns) luminescent layers of SiC doped with Sc was carried out in a medium of Ar at one at.g. and at a temperature of from 2300° to 2400° C. Sc in the form of a spectrally-pure metal or scandium oxide was disposed in the cooler part of the crucible at a temperature of from 1700° to 2200° C. The size of the source was from 60 to 80 mm and the gap width was from 0.6 to 1.5 mm.

EXAMPLE 4

A process for producing hole-type SiC doped with boron was carried out at a temperature of from 1800° to 1900° C. and under reduced pressure of an inert gas, for example Ar ($10^{-1}$ to $10^{-2}$ mm Hg), with weak flow of a volatile boron-containing substance such as $BH_3$ $BF_3$ or $BBr_3$ being fed into the crucible through a controlled nozzle. The size of the source was from 60 to 80 mm and the gap width was from 0.8 to 2.5 mm.

EXAMPLE 5

A process for producing electron-conduction SiC doped with oxygen or nitrogen, which is in particular used as a basis for creating light-emitting diodes, was carried out at a temperature of from 1700° to 1800° C. and under reduced pressure of from $10^{-2}$ to $10^{-4}$ mm Hg. The pressure was achieved by introducing oxygen or an oxygen-containing gas such as CO or $H_2O$, and nitrogen or a nitrogen-containing gas such as $NH_3$ by means of a controlled nozzle. The process produced layers having the highest luminescent properties. The size of the source was from 60 to 80 mm and the gap width was from one to six mm.

EXAMPLE 6

A process for producing thick (at least 100 microns) non-doped SiC layers was carried out in a medium of Ar or He at normal pressures and at a temperature of from 2200° to 2300° C. The size of the source was from 60 to 80 mm and the gap width was from 0.6 to 0.8 mm.

EXAMPLE 7

A process for producing luminescent-active layers of SiC doped with Be in the pure or carbide form was carried out in a medium or Ar or He at a pressure of from 0.1 to 1.0 mm Hg and a temperature of from 1850° to 1950° C. The size of the source was from 60 to 80 mm and the gap width was from 0.7 to 1.0 mm.

What is claimed is:

1. In a method of epitaxially producing semiconductor silicon carbide comprising the steps of: subliming solid silicon carbide to produce silicon carbide vapors and depositing the vapors on seed crystals of silicon carbide, the improvement comprising performing the steps of sublimation and deposition in an inert medium at a temperature of from 1600°–2400° C. and a pressure of from one atmosphere to $10^{-5}$ mm Hg. and arranging the solid silicon carbide and the seed crystals in a parallel relationship at a distance not exceeding 0.2 of the maximum linear dimension of the solid silicon carbide measured in the direction perpendicular to the distance separating the solid silicon carbide and the seed crystals.

2. The method as claimed in claim 1, further comprising performing the step of sublimation in the presence of at least one doping element for silicon carbide selected from the group consisting of Be, B, Al, Ga, Sc, O and N.

3. The method as claimed in claim 1, wherein the maximum linear dimension of the solid silicon carbide is from 60 to 80 mm and the distance separating the solid silicon carbide and the seed crystals is from 0.6 to 6 mm.

* * * * *